United States Patent
Piatek (10) Patent No.: US 11,415,686 B2
(45) Date of Patent: Aug. 16, 2022

(54) METHOD OF MODELLING A SCANNING DISTANCE SENSOR FOR PROTOTYPING PARAMETERS OF SUCH SENSOR AND/OR FOR PROTOTYPING SOFTWARE PROCESSING THE OUTPUT OF SUCH SENSOR

(71) Applicant: Aptiv Technologies Limited, St. Michael (BB)

(72) Inventor: Marcin Piatek, Cracow (PL)

(73) Assignee: Aptiv Technologies Limited, St. Michael (BB)

( * ) Notice: Subject to any disclaimer, the term of this patent is extended or adjusted under 35 U.S.C. 154(b) by 763 days.

(21) Appl. No.: 16/401,742

(22) Filed: May 2, 2019

(65) Prior Publication Data
US 2019/0361101 A1 Nov. 28, 2019

(30) Foreign Application Priority Data
May 23, 2018 (EP) .................................... 18173877

(51) Int. Cl.
*G01S 17/10* (2020.01)
*G01S 7/497* (2006.01)
*G01S 7/48* (2006.01)
*G01S 7/481* (2006.01)
*G01S 17/931* (2020.01)

(52) U.S. Cl.
CPC .......... *G01S 7/4972* (2013.01); *G01S 7/4808* (2013.01); *G01S 7/4817* (2013.01); *G01S 17/10* (2013.01); *G01S 17/931* (2020.01)

(58) Field of Classification Search
CPC .. G06Q 30/0201; G06Q 20/202; G06N 20/00; G06N 5/022; G09B 5/10; G09B 5/06; G06K 9/00255; G06F 3/014; G06F 3/012
USPC .......................................... 356/4.02; 701/428
See application file for complete search history.

(56) References Cited

U.S. PATENT DOCUMENTS

| 2013/0231857 A1* | 9/2013 | Beaurepaire ........... G01C 21/20 701/428 |
| 2016/0073229 A1* | 3/2016 | Haro ...................... H04W 4/021 455/456.3 |

OTHER PUBLICATIONS

Niklas Peinecke et al: "Lidar simulation using graphics hardware acceleration", Oct. 26, 2008, pp. 4.D.41 through 4.D.4.8.
Ballard P et al: "Simulation and understanding of range images acquired in fast motion", May 8, 1994, pp. 2242 through 2247.
(Continued)

*Primary Examiner* — Phuoc H Doan
(74) *Attorney, Agent, or Firm* — Sawtooth Patent Group PLLC (57) ABSTRACT

A method of modelling a scanning distance sensor determining a set of detections is determined as if obtained by the sensor when scanning a field of view of the sensor, wherein each of the detections corresponds to a different line of sight originating from the sensor and comprises information about the orientation of the respective line of sight and about the distance of a respective target point from the sensor, the target point being the point in space where the line of sight first crosses any of the objects at the respective point in time. The method includes that the set of detections is modified by estimating the effect of sequentially scanning the field of view in discrete time steps on the detections and inversely applying the estimated effect to the set of detections.

20 Claims, 4 Drawing Sheets

(56) References Cited

OTHER PUBLICATIONS

Li Jicheng et al: "A fast 3D image simulation algorithm of moving target for scanning laser radar", Oct. 15, 2014, 8 pages.
Bai-Yun Li et al: "A Method of Fast Laser Scanner Simulation in ALV", Dec. 26, 2009, pp. 3941 through 3945.
Kim, et al., "Simulation of a Geiger-Mode Imaging LADAR System for Performance Assessment", Jul. 2013, 30 pages.
"Foreign Office Action", EP Application No. 18173877.4, dated Dec. 15, 2021, 3 pages.

* cited by examiner

METHOD OF MODELLING A SCANNING DISTANCE SENSOR FOR PROTOTYPING PARAMETERS OF SUCH SENSOR AND/OR FOR PROTOTYPING SOFTWARE PROCESSING THE OUTPUT OF SUCH SENSOR

CROSS-REFERENCE TO RELATED APPLICATION

This application claims priority to European Patent Application Number 18173877.4, filed May 23, 2018, the disclosure of which is hereby incorporated by reference in its entirety herein.

TECHNICAL FIELD OF INVENTION

This disclosure generally relates to a method of modelling a scanning distance sensor for prototyping parameters of such sensor and/or for prototyping software processing the output of such sensor.

BACKGROUND OF INVENTION

Scanning distance sensors are sensors that are capable of determining distances between the sensor and objects located in a certain region of the surroundings of the sensor, such as a field of view of the sensor, wherein the sensor does not capture the entire region at once, but scans the region, i.e., the sensor successively captures a plurality of individual points preferably regularly distributed over the region. For example, in the automotive industry LIDAR (which is an acronym for "light detection and ranging") sensors are widely used, in particular in the context of advanced driver assistance systems, and their number and precision grow from year to year.

A LIDAR sensor comprises a light emitter, in particular a laser emitter, and a light detector for detecting reflections of the emitted light. To distinguish the reflections from other light that hits the detector, the emitted light is preferably modulated or pulsed. The light's time of flight, i.e., the time from emitting the light to detecting its reflection, can be used as a measure for the distance between the point where the light was reflected and the sensor. Alternatively, or additionally to the time of flight, also interferences and/or changes of wavelength may be used to derive such distance information. Because it is challenging both to sufficiently illuminate an entire field of view of the sensor by the emitted light and to spatially resolve the reflections of the emitted light returning simultaneously from different points of the field of view, distances are usually measured only for a single point at a time. Hence, to measure distances over the entire field of view of the sensor, the sensor scans the field of view, point-by-point, determining for each point its distance to the sensor.

When scanning the field of view of the sensor, the line of sight of the sensor, i.e., the line along which the light is emitted from the sensor and along which the reflection returns to the sensor (which at least approximately occurs along the same line), is changed in discrete angular steps, for example by rotating the sensor or tilting a mirror of the sensor. The orientation of the line of sight can be described by two angles: the azimuth angle $\alpha$, which is the horizontal angle with respect to a reference direction where the azimuth angle is zero, and the elevation angle $\theta$, which is the vertical angle with respect to the horizontal plane and, hence, is an adjacent angle to the polar angle, which is the vertical angle with respect to the vertical axis, with the elevation angle and the polar angle adding up to 90°. Generally, instead to of the elevation angle also the polar angle can be used to describe the orientation of the line of sight. Scanning preferably occurs along a regular scanning grid so as to evenly cover the entire field of view, with each point of the scanning grid corresponding to another orientation of the line of sight of the sensor, wherein the points of the scanning grid are spaced apart from each other in the azimuthal and in the polar direction by constant angular steps.

For each of the orientations of the line of sight set during scanning, i.e., for each corresponding pair of azimuth angle and elevation angle, a distance of the point at which the emitted light is reflected can be measured. (For lines of sight along which no reflection can be detected, either because the line of sight does not cross any object or because the object is too far away from the sensor, the distance can be set to be infinity or to a certain maximum value.) Scanning the sensor's field of view therefore results in a three dimensional point cloud the points of which are each defined by an azimuth angle, and elevation angle and a distance, with these two angular values and one radial value corresponding to coordinates of the respective point in a kind of spherical coordinate system the central point of which is defined by the sensor.

For prototyping parameters of a scanning distance sensor, such as a LIDAR sensor, and/or for prototyping software processing the output of such sensor it is useful to model the sensor. Sensor models are particularly used in the automotive industry, and may, for example, help optimize the positioning of one or more sensors on a vehicle or evaluate the number, the arrangement and the kind of sensors required for reliably providing information about a vehicle's environment. The sensor model can be divided into three different parts: (i) a geometry model by which objects, such as vehicles, vulnerable road users (VRU), buildings, roads, trees, etc., and their motions are modelled in three-dimensional space; (ii) a radiometry model which describes how the light propagates under different conditions, in particular weather conditions, and how the light is reflected by different types of material and different surfaces; and (iii) a detection model describing how the detector responds to incident light, in particular to different intensities of incident light. Furthermore, the sensor model can also be combined with traffic modelling, for example.

The geometry model part of the sensor model can for example comprise that a scanning distance sensor and one or more objects in the surroundings of the sensor are modelled, wherein the model includes, for the sensor and each of the objects, information about their respective locations and velocities in three-dimensional space. The model can then be used to create a set of detections as if obtained by the sensor when scanning a field of view of the sensor, wherein each of the detections corresponds to a different line of sight originating from the sensor and comprises information about the orientation of the respective line of sight and about the distance between a respective target point and the sensor, the target point being the point in space where the line of sight first crosses any of the objects.

In order to capture movements of the objects, such set of detections can repeatedly be determined for successive points in time so as to obtain a time sequence of sets of detections. However, especially because the geometry model is usually computationally rather expensive, all detections of an individual set of detections are usually determined as if obtained simultaneously at a single point in time. In a real measurement, on the contrary, due to the scanning, the individual detections are determined sequentially according to the order in which the sensor's line of sight is oriented in different directions. Therefore, the detections obtained in a real scanning measurement reflect different points in time, preferably with a constant time step between successive detections. If the objects in the sensor's field of the view move, this leads to distortions in the set of detections. In the sensor model, conversely, this effect of sequentially scanning the field of view in discrete time steps is usually neglected.

This may be no problem for scanning distance sensors that are used in rather static environments, e.g., in geodetic scanning measurements. In automotive applications, however, the effect can be rather important. For example, if the sensor is considered to be mounted on a vehicle that drives at 50 km/h and detects an object, such as another vehicle, driving at 50 km/h towards the vehicle, and the sensor scans at a frame rate of about 25 Hz, i.e. the sensor needs about 40 ms for a full scan of its field of view, in the time between the first detection and the last detection of the scan the object approaches the vehicle by more than 1 m. This results in distortions in the measured point cloud that have to be taken into account when the results of the measurement are to be used in critical applications such as an advanced driver assistance system, for example. Consequently, the effect of sequential scanning on the detections should be included in modelling the scanning distance sensor, too.

SUMMARY OF THE INVENTION

Described herein are techniques to provide an improved method of modelling a scanning distance sensor for a more reliable prototyping of parameters of such sensor and/or of software processing the output of such sensor, wherein the method provides results which more closely correspond to results as obtained by a real scanning distance sensor, though without significant increase in computational complexity.

The method according to the invention comprises that a model of the sensor and of one or more objects in the surroundings of the sensor is defined, wherein the model includes, for the sensor and for each of the objects, information about its respective location and velocity in three-dimensional space. Preferably the location is given as Cartesian coordinates, wherein the coordinates may be defined relative to the location of the sensor. In other words, the sensor may define the central point of the coordinate system. If the sensor itself is moving, the center of the coordinate system may be defined by the initial location of the sensor, for example, or can be moving together with the sensor. In this latter case, the locations of the objects are relative to the current location of the sensor. The velocities are preferably linear velocities described by a vector in Cartesian coordinates. Similarly, to the locations, the velocities can be absolute velocities or can be defined in relation to the velocity of the sensor. If the velocities are relative to the sensor or if the sensor is static, the sensor's velocity of course is always zero.

The method further comprises that, for at least one point in time, a set of detections is determined such as if the detections were obtained by the sensor when the sensor scans its field of view. The method may include that for different points in time, different sets of detections are determined. Each of the detections of one set corresponds to a different line of sight originating from the sensor and comprises information about the orientation of the respective line of sight and about the distance between a respective target point and the sensor, the target point being the point in space where the line of sight first crosses any of the objects at the respective point in time, for which the set of detections is determined.

The lines of sight, for which the detections are determined, differ in particular with respect to their respective orientations, each of which can be fully defined by two angles, such as an azimuth angle and an elevation angle. The elevation angle is preferably defined with respect to the horizontal plane but may in general also correspond to a polar angle defined with respect to the vertical axis. Preferably the lines of sight are evenly distributed over the field of view of the sensor, for example angularly regularly spaced from each other with respect to the azimuthal direction and the polar direction. The distribution of the lines of sight along which distances are measured to determine the detections defines a scanning grid according to which the field of view is scanned. For each line of sight, the distance between the sensor and the target point where the line crosses one of the objects is determined as if the distance were measured by a real sensor by means of the light which is emitted along the line of sight and at the target point is reflected back along the line of sight to the sensor. Thus, each detection is attributed at least three values, i.e., the two angles of the orientation of the respective line of sight and the distance of the respective target point. These three values can be regarded as coordinates of the target point in a spherical coordinate system and hence, fully define the target point's location.

Such set of detections can be determined for multiple points in time, in particular continuously with a constant frame rate which preferably reflects the scanning rate of the modelled sensor. However, as described above, all detections of an individual set relate to target points which are defined for the same respective point in time. This difference to a real scanning measurement is due to the computational complexity of geometrically modelling the sensor and the objects. In order to keep the computational effort at a low level, a static snapshot of the (possibly moving) objects is taken as the basis for determining all detections of a respective set. This is why the determined set of detections deviates from a set of detections that one would obtain in a real scanning measurement of the modelled objects.

The compensate for these deviations, the method according to the invention further comprises that the determined set of detections is modified by estimating the effect of sequentially scanning the field of view in discrete time steps on the detections and by inversely applying the estimated effect to the set of detections. In a real sequential scanning, a first measurement is performed along a first line of sight and returns the distance of the corresponding target point of one of the objects; a second measurement is only performed a short time after that along a slightly differently oriented second line of sight and returns the distance of the corresponding target point which is probably located on the same object, but the object may have moved in the meantime. Instead of expensively reproducing such sequential scanning in the model, the method according to the invention first determines the detections as if time stood still and then estimates what effect an actual sequential scanning would have had on the detections due to movement of the objects. The estimated effect is then inversely applied to the set of detections so as to kind of correct the simultaneity of the detections. Inversely applying the estimated scanning effect may occur as a kind of backward propagation based on the known velocities of the objects. By such approach the detections resulting from the model more precisely reflect detections to be expected from a real scanning distance measurement and, hence, can serve as a more reliable basis for prototyping a real sensor, while at the same time the computational costs of the modelling do not excessive increase.

The said modifying the determined set of detections, i.e. the said estimating and inversely applying the effect of sequential scanning on the detections, preferably comprises that a scanning order of the detections is defined and that the following steps are executed for each detection of the set of detections: determining a scanning delay depending on the position of the detection within the scanning order; calculating the location of the respective target point from the orientation of the respective line of sight and the distance between the target point and the sensor; based on the target point's location, calculating a modified location of the target point from the scanning delay and the velocity of the object on which the target point is located; based on the target point's modified location, calculating a modified distance between the target point and the sensor and a modified orientation of the line of sight such that the line of sight crosses the target point at the modified location; and modifying the detection so as to comprise information about the modified orientation and the modified distance.

To retroactively compensate the simultaneity of the detections, first a chronology has to be introduced into the model. This is achieved by defining the scanning order which is the temporal succession according to which the detections are assumed to be determined. The scanning order preferably corresponds to a scanning order as used in real scanning distances sensors. For example, the field of view may first be scanned horizontally over its full width by incrementally increasing (or decreasing) the azimuth angle, then the elevation angle is increased (or decreased) by one increment and the field of view is scanned again horizontally over its full width, but this time by incrementally decreasing (or increasing) the azimuth angle, after which the elevation angle is again increased (or decreased) by one increment, and so on, until the entire field of view is scanned line-by-line.

Based on the scanning order, each detection can be attributed a scanning delay. The scanning delay in particular corresponds to a time difference between the nominal point in time, i.e., the said one point in time for which the set of detections is determined, and the point in time at which the respective individual detection assumedly would have been determined in a real sequential scanning. Preferably the time step between successive detections is assumed to be constant. The last detection with respect to the scanning order may be assumed to be determined at the nominal point in time, though there may also be a scanning offset between the last detection and the nominal point in time. Calculating the scanning delay of a detection can in particular comprise calculating the difference between a maximum delay, which corresponds to the first detection, and the product of the respective detection's position within the scanning order times a constant time step. This applies if the position is zero-based; if, however, the position is one-based, the position is preferably subtracted by one prior to the multiplication.

The scanning delay together with the given velocity of the object the respective target point is located on can then be used to determine where the target point had been at the nominal point in time minus the scanning delay. To do so, first the location of the target point is calculated based on the orientation of the respective line of sight and the distance between the target point and the sensor. This in particular corresponds to a conversion of spherical coordinates to Cartesian coordinates. The resulting location of the target point is then modified accordingly, in particular by subtracting from the location the product of the velocity of the target point's underlying object times the respective scanning delay. (Because the sensor itself might be moving, but only the relative movement is relevant to the scanning effect, for calculating the modified location of the target point the said velocity preferably is the relative velocity of the object with respect to the sensor.) In other words, the objects are moved back in time to where they have been when the respective detection assumedly would have been determined in a real scanning. By thus retroactively taking into account the movement of the objects, the effect of sequentially scanning the sensor's field of view is inversely applied (back propagated) to each individual target point and the detections are adapted accordingly. To this end, a modified distance between the target point and the sensor and a modified orientation of the line of sight are calculated based on the modified location of the target point. This in particular corresponds to converting Cartesian coordinates of the modified location of the target point to spherical coordinates the two angular values of which define the modified orientation of the line of sight and the radial value of which defines the modified distance of the target point to the sensor.

Finally, each detection is modified so as to include information about the respective modified orientation and the respective modified distance. Preferably, the original orientation is simply replaced by the modified orientation, and the original distance is simply replaced by the modified distance. The modified set of detections is then formed by these modified detections and corresponds to a modified three-dimensional point cloud which is distorted with respect to the original point cloud, wherein the distortion at least approximately corresponds to distortions which would result as an effect of sequentially scanning moving objects in a real scanning distance measurement.

Since by inversely applying the estimated scanning effect to the detections the orientations of the lines of sight along which the distances are determined are modified, they can deviate from the scanning grid according to which the distances are measured in a scanning measurement, wherein such scanning grid is defined by the original orientations of the lines of sight, which are preferably regularly distributed over the entire field of view of the sensor as described above. To re-align the detections to the scanning grid, according to an embodiment of the invention, the determined set of detections is further modified by, after the estimated effect has inversely been applied to the set of detections, aligning the resulting detections with a scanning grid defined by the original orientations of the lines of sight.

Preferably, the said modifying the determined set of detections, i.e. in particular the said aligning, comprises that, for each of the detections, an aligned orientation is determined by approximating the respective modified orientation to the orientation of the original line of sight most closely corresponding to the line of sight having the modified orientation. Because such approximation which re-aligns the detections with the scanning grid at least slightly changes the orientation, in particular the azimuth angle and/or the elevation angle, of the detection, it is useful to also determine correspondingly adapted locations of the respective target points. According to a further embodiment of the invention, the said modifying the determined set of detections, i.e., in particular the said aligning, further comprises that, for each of the detections, an aligned location of the respective target point is calculated from the aligned orientation of the respective line of sight and the modified distance between the target point and the sensor. This calculation in particular corresponds to a conversion from spherical coordinates comprising the angles of the aligned orientation as the angular values and the distance of the target point as the radial value to Cartesian coordinates of the target point after alignment.

The objective of the invention is furthermore solved by a computer program product and, in particular, by a computer program product with a computer program which has software means for carrying out a method in accordance with at least one of the embodiments described above if the computer program is executed in a computing device. It is an advantage of the inventive method that the calculations can be executed in parallel on different processor cores. Therefore and because of the low computational complexity of the method, the computations can be executed relatively fast.

Further features and advantages will appear more clearly on a reading of the following detailed description of the preferred embodiment, which is given by way of non-limiting example only and with reference to the accompanying drawings.

BRIEF DESCRIPTION OF DRAWINGS

Further details will now be described, by way of example with reference to the accompanying drawings, in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Figure 1:
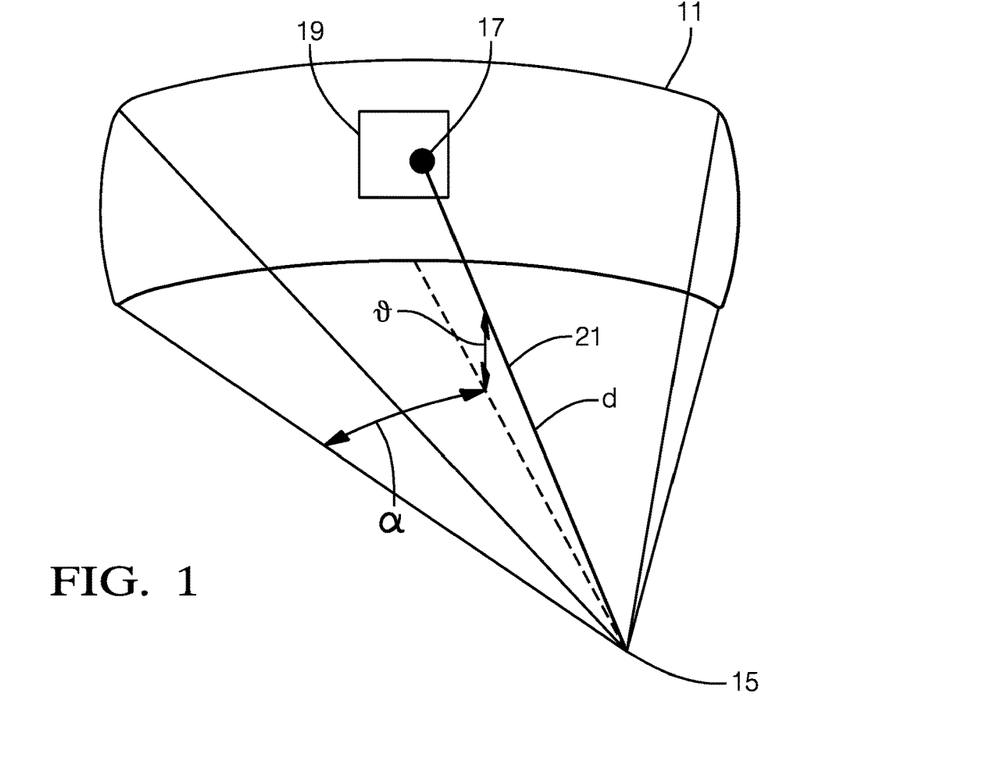
FIG. 1 shows a schematic illustration of the field of view of a scanning distance sensor to be modelled according to the invention.

FIG. 1 shows a schematic illustration of a field of view 11 of a scanning distance sensor 13, such as a LIDAR sensor, (cf. FIG. 2) which is located at the central point 15 of the field of view 11. The field of view 11 corresponds to a region in space defined by a certain azimuthal angular range and a certain polar angular range with respect to the central point 15. In general, the field of view 11 is not limited in the radial direction but may be restricted to a maximum radial distance corresponding to the detection range of the sensor 13. In FIG. 1 in the radial direction only a part of the field of view 11 is shown which extends up to the distance by which a target point 17 located on an object 19 within the field of view 11 is distanced from the sensor 13. The target point 17 is defined as the point where a line of sight 21 originating from the sensor 13 at the central point 15 crosses the object 19. The location of the target point 17 is therefore fully defined by the orientation of the line of sight 21, given as the azimuth angle $\alpha$ and the elevation angle $\theta$ of the line of sight 21 and the distance d between the target point 17 and the sensor 13 located at the central point 15.

The line of sight 21 is one of a plurality of defined lines of sight 21 of the sensor 13 whose orientations regularly cover the entire field of view 11 of the sensor 13 according to a scanning grid (cf. FIGS. 3 and 5), the orientations differing from each other by multiples of a predetermined azimuthal increment and a predetermined elevation increment. Given a geometric model of the sensor 13 and of one or more objects 19 in the surroundings of the sensor 13, a set of detections 23 can be determined comprising for each of the lines of sight 21 one detection 23 which includes information about the orientation of the respective line of sight 21, i.e., its azimuth angle $\alpha$ and elevation angle $\theta$, as well as about the distance d of the respective target point 17 to the sensor 13. If the respective line of sight 21 does not cross any of the objects 19, the distance d is assumed to be the maximum radial distance of the field of view 11; alternatively, the distance d can be assumed to be infinity.

Figure 2:
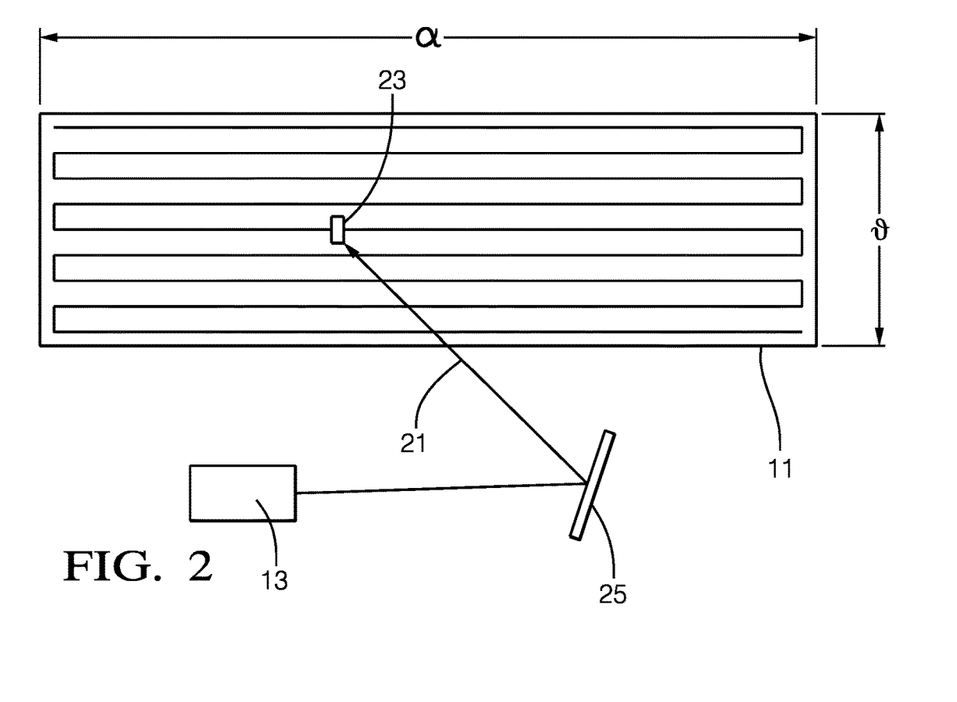
FIG. 2 shows a schematic illustration of a real scanning process.

FIG. 2 schematically illustrates the process of scanning the field of view 11 by a real sensor 13. In FIG. 2 the field of view 11 is represented by a rectangle whose horizontal extension corresponds to the azimuthal extension of the field of view 11 and whose vertical extension corresponds to the polar extension of the field of view 11. Light emitted by the sensor 13 is guided by means of a mirror 25 along a respective one (cf. arrow in FIG. 2) of the lines of sight 21 defining the scanning grid, then hits an object 19 at a target point 17 and is (partly) reflected to the sensor 13 at least essentially along the same line of sight 21. The light's time of flight is then used to determine the distance of the target point 17 to the sensor 13.

As illustrated in FIG. 2 by the continuous meandering path, the field of view 11 is scanned line-by-line starting at a corner of the field of view 11. After a first detection 23 is determined for the line of sight 21 corresponding to the starting point, the mirror 25 is tilted to change the azimuth angle $\alpha$ of the emitted and reflected light by a constant increment so that the light follows a second line of sight 21 and a second detection can be determined. This is repeated until the field of view 11 has been scanned at the same elevation $\theta$ over its full horizontal, i.e., azimuthal, extension. Then the mirror 25 is tilted so as to increase (or decrease) the elevation $\theta$ by a constant increment and thereby start a new line which is then scanned in the reverse direction over the full horizontal, i.e., azimuthal, extension of the field of view 11. The scanning is continued in this manner, wherein after each incremental change of azimuth angle or elevation angle $\alpha$ respective detection 23 is determined, until the entire field of view 11 is scanned. The indicated path along which the field of view 11 is scanned defines a scanning order, i.e., a temporal succession according to which the detections 23 are determined. All the detections 23 of a single scan form a set of detections 23.

Figure 3:
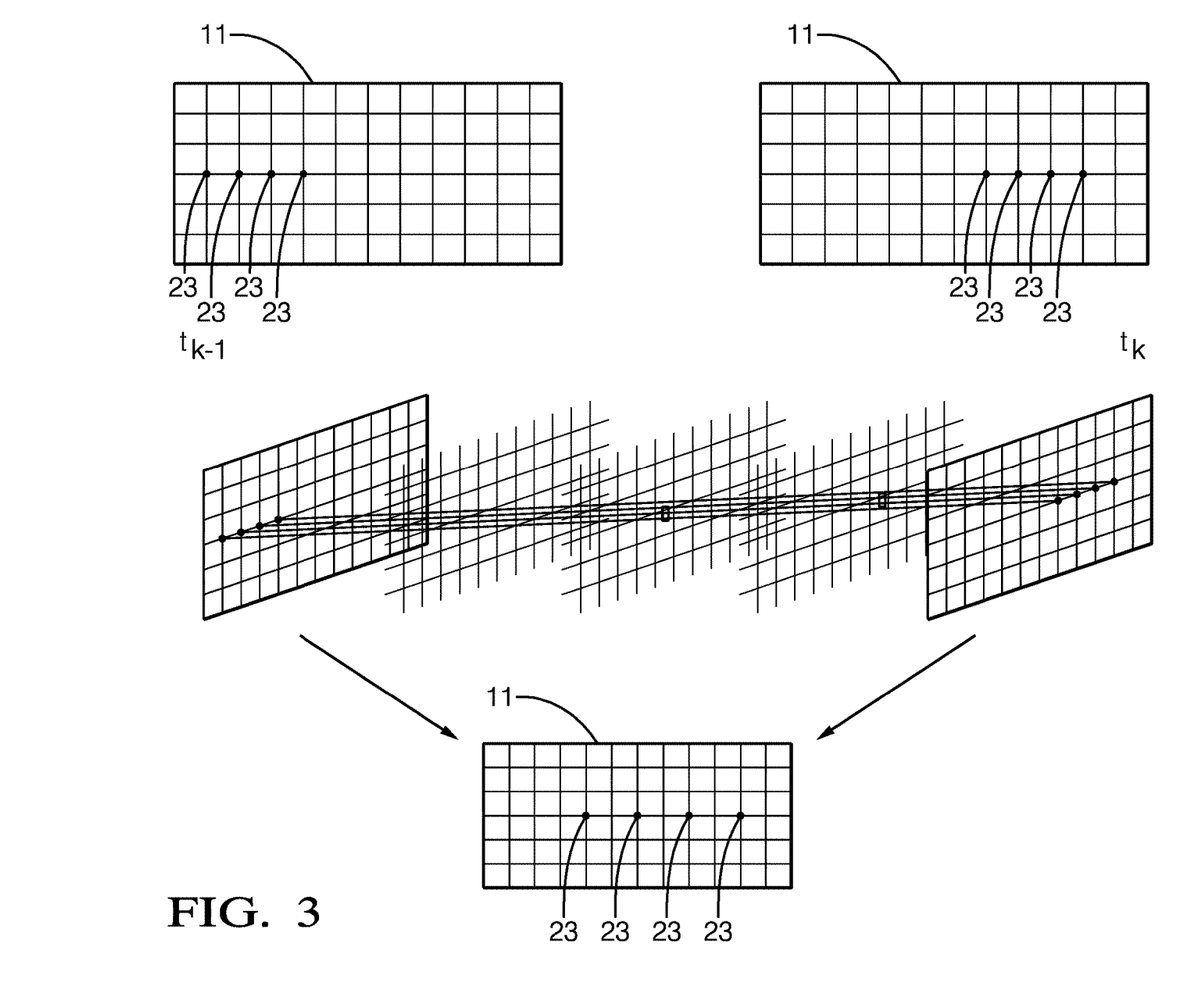
FIG. 3 illustrates the effect of sequentially scanning moving objects on the resulting detections.

Such set of detections 23 can also be calculated for the model of the sensor 13 and the objects 19, by determining for each of the lines of sight 21 having a respective azimuth angle $\alpha$ and a respective elevation angle $\theta$ the respective target point 17 and its distance d to the sensor 13. While multiple such sets can be determined for different points in time, each set is determined for a single point in time, with each detection 23 being derived from the locations of the objects 19 at that same point in time. However, in a real scanning distance measurement, the detections 23 stem from at least slightly different points in time. Hence, if the objects 19 are moving, the resulting set of detections 23 is distorted. This is illustrated in FIG. 3 in which the upper left rectangle represents the sensor's field of view 11 including a set of detections 23 (only a few of which are indicated) obtained for an object 19 at the time $t_{k-1}$, and the upper right rectangle represents the sensor's 13 field of view 11 including a set of detections 23 obtained for the same object 19 at the time $t_k$, with the square grid corresponding to the scanning grid and each of the grid's crossing points corresponding to one of the lines of sight 21 of the sensor 13 and a respective target point 17. Because the object 19 which the four shown detections 23 relate to is moving, for the two different points in time $t_{k-1}$ and $t_k$ the corresponding detections 23 are at different locations within the field of view 11.

The detections 23 in the upper right rectangle are each determined at the same time $t_k$. However, as illustrated in the lower part of FIG. 3, if the field of view 11 is in fact scanned sequentially, the four detections 23 shown in FIG. 3 which correspond to the moving object 19 are determined at different intermediate times between $t_{k-1}$ and $t_k$. These intermediate times are shown as additional intermediate grids in the center of FIG. 3. As an effect of sequentially scanning the field of view 11, instead of the set of detections 23 shown at the upper right of FIG. 3, one obtains the set of detections 23 shown at the bottom of FIG. 3 which is a combination of the detections 23 obtained at the different intermediate times due to the sequentially of the scanning. Hence, a similar distortion to the detections 23 as the one resulting from the scanning (bottom rectangle in FIG. 3) is preferably also applied to the detections 23 obtained for the same point in time from modelling the sensor 13 and the surrounding objects 19 (top right rectangle in FIG. 3).

Figure 4:
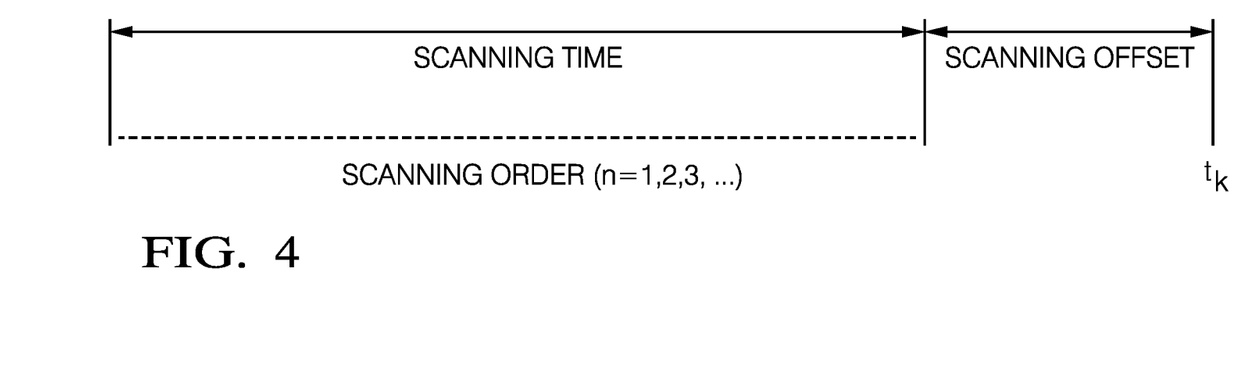
FIG. 4 illustrates the scanning delay of the detections.

In order to estimate the described effect of sequential scanning on the detections 23, a scanning delay is determined for each of the detections 23. This is illustrated in FIG. 4 which shows a timeline in which the dots of the dotted line correspond to individual detections 23 in their assumed temporal succession according to the scanning order (cf. FIG. 2). The time step $t_{step}$ between two successive detections 23 is constant. The scanning time for all detections 23 then is the product of the number of detections 23 times the time step $t_{step}$. The time corresponding to the last detection 23 is not necessarily equal to the nominal time $t_k$ for which the set of detections 23 is determined (right end of the timeline in FIG. 4), because in a real measurement there may also be a scanning offset between the last detection 23 and the nominal time, as shown in FIG. 4. The scanning time and the scanning offset together define a maximum scanning delay $\Delta t_{max}$. The scanning delay $\Delta t_n$ of a detection 23 at position n within the scanning order (the position being one-based) can then be calculated as follows:

$$\Delta t_n = \Delta t_{max} - t_{step} \cdot (n-1). \qquad (1)$$

Based on the scanning delay the locations of the target points 17 can be modified. For this, first the locations of the target points 17 are calculated as vectors in Cartesian coordinates from the azimuth angle $\alpha$, the elevation angle $\theta$ and the distance d of the respective detection 23:

$$\begin{bmatrix} x \\ y \\ z \end{bmatrix} = \begin{bmatrix} d \cdot \cos(\theta) \cdot \sin(\alpha) \\ d \cdot \cos(\theta) \cdot \cos(\alpha) \\ d \cdot \sin(\theta) \end{bmatrix}. \qquad (2)$$

A modified location of a target point 17 is then calculated by subtracting from the target point's 17 original location the velocity of the respective object 19 which the target point 17 is located on, as described by the following equation $$\begin{bmatrix} x' \\ y' \\ z' \end{bmatrix} = \begin{bmatrix} x \\ y \\ z \end{bmatrix} - \begin{bmatrix} v_x \\ v_y \\ v_z \end{bmatrix} \cdot \Delta t_n. \qquad (3)$$

Then the modified orientation, i.e. the modified azimuth angle $\alpha'$ and the modified elevation angle $\theta'$, as well as the modified distance d' of the respective detection 23 can be obtained by converting the modified location to spherical coordinates according to the following set of equations $$d' = \sqrt{x'^2 + y'^2 + z'^2} \qquad (4)$$

$$\alpha' = \tan^{-1}\left(\frac{y'}{x'}\right)$$

-continued $$\theta' = \sin^{-1}\left(\frac{z'}{d'}\right).$$

Figure 5:
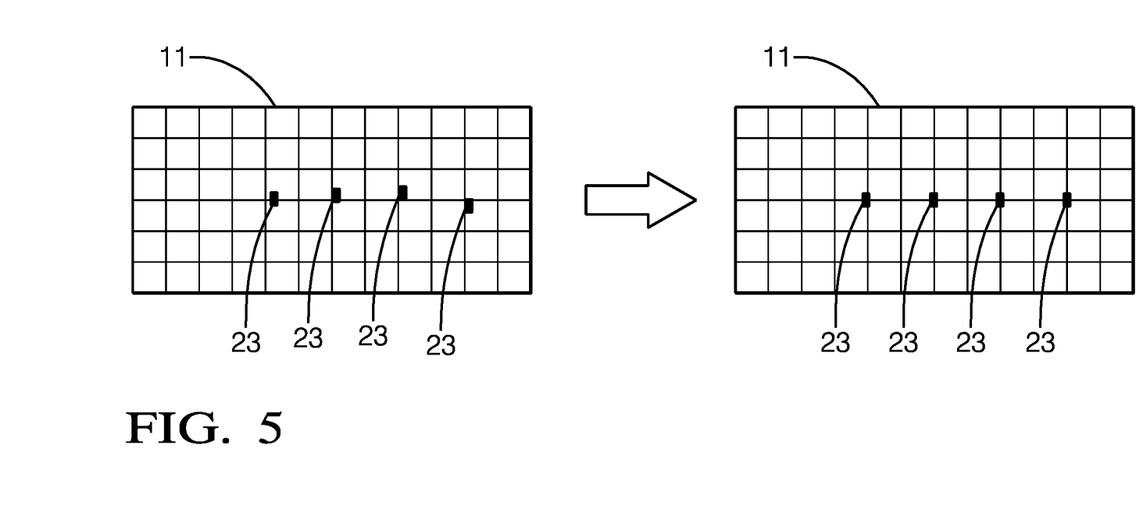
FIG. 5 illustrates aligning the modified detections with the scanning grid.

Because the modified azimuth angle α' and the modified elevation angle θ' may no longer correspond to one of the original lines of sight 21 of the scanning grid, the angles are then aligned to the scanning grid by approximation to the closest values corresponding to one of the points of the scanning grid. This is illustrated in FIG. 5 in which the left rectangle shows modified detections 23 whose modified azimuth angles α' (corresponding to the horizontal axis in the rectangle) and modified elevation angles θ' (corresponding the vertical axis) do not lie on the crossing points of the square grid which correspond to orientations of the original lines of sight 21 defining the scanning grid. In the right rectangle of FIG. 5 the detections 23 are then aligned to the grid by the said approximation.

After executing these steps, the detections 23 that were derived for a single point in time based on the model of the sensor 13 and the objects 19 are distorted similarly as if they had been determined sequentially for successive points in time like in a real scanning measurement so as to be better suited as a basis for prototyping scanning distance sensors or software processing the output of such sensors.

For illustrating the set of detections 23 as a point cloud or for performing further calculations or analyses based on the obtained detections 23, it can be useful to calculate aligned locations of the target points 17 corresponding to the individual detections 23. Such aligned locations can be obtained by converting the aligned modified azimuth angle, the aligned modified elevation angle, and the modified distance for each detection 23 to Cartesian coordinates by replacing the azimuth angle α, the elevation angle θ and the distance d in equation (2) by their respective modified and aligned versions.

Figure 6:
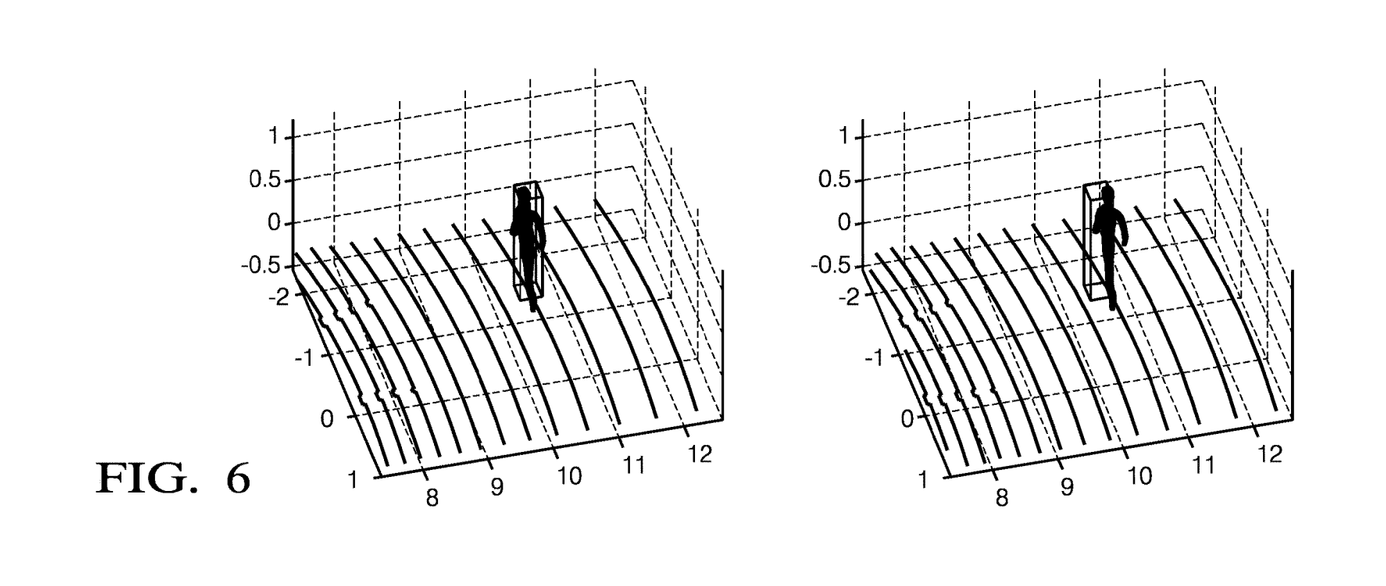
FIGS. 6 and 7 show examples of point clouds corresponding to a respective set of detections before and after the estimated effect of sequential scanning is inversely applied to the set of detections according to the inventive method.
Figure 7:
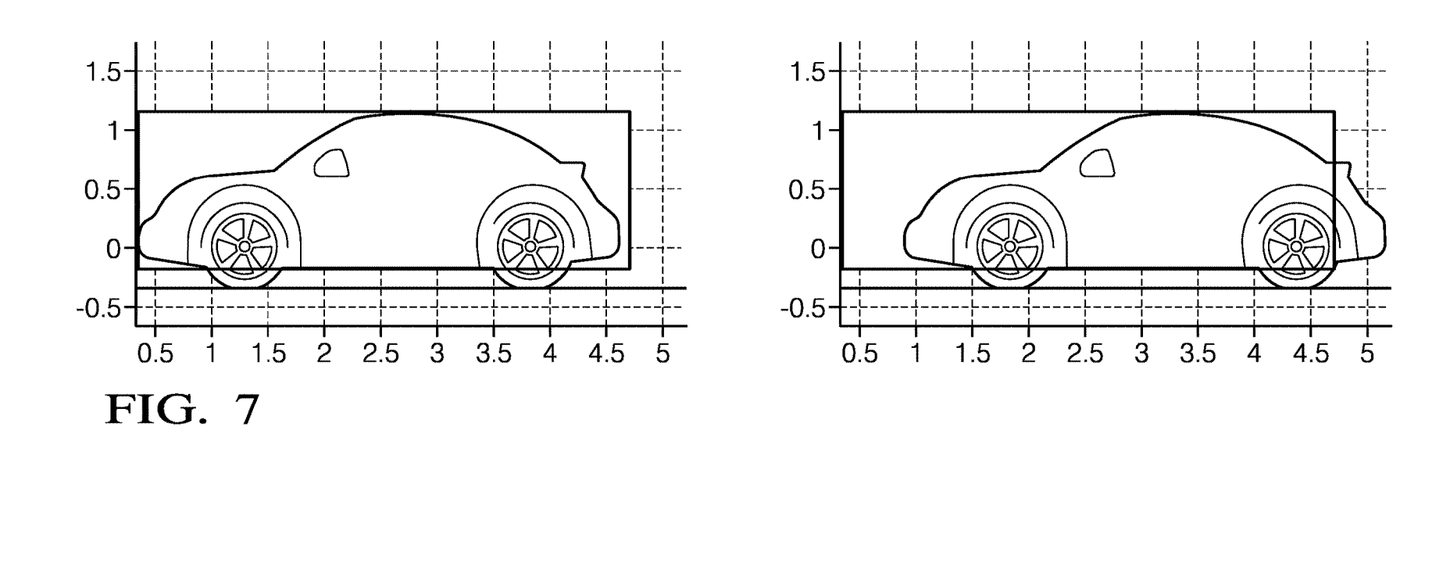

FIGS. 6 and 7 show two examples of point clouds derived from respective models. In FIG. 6, the model includes a pedestrian walking from right to left in the field of view 11 of the sensor 13, while the sensor 13 itself is moving toward the pedestrian. The model used for FIG. 7 includes a car driving from right to left, while the sensor 13 moves towards the car. In both Figures, the left side shows the point cloud for the set of detections 23 determined for a fixed point in time without applying an estimated effect of sequential scanning, whereas the right side shows the point cloud for the same set of detections 23 after the detections have been modified according to the invention by inversely applying the estimated scanning effect. The boxes overlaid to the point clouds indicate the real location of the pedestrian or car, respectively. As one can see, on the right side the point cloud appears to be distorted and shifted with respect to the real location. These distortions at least approximately correspond to distortions actually resulting from sequentially scanning a field of view 11 containing objects 19 that move with respect to the sensor 13.

However, while in a real scanning measurement such distortion is a generally unwanted scanning artefact, in modelling the sensor 13 and the objects 19 surrounding the sensor 13 retroactively inducing a similar distortion is an improvement. This is because it leads to results that more closely correspond to real scanning measurements without the need of fully simulating the actual sequential scanning. Hence, the model according to the invention provides a more reliable basis for prototyping scanning distance sensors in a computationally efficient manner.

While this invention has been described in terms of the preferred embodiments thereof, it is not intended to be so limited, but rather only to the extent set forth in the claims that follow.

I claim:

1. A method of modelling a scanning distance sensor, wherein the method comprises:
    defining a model of the sensor and of one or more objects in surroundings of the sensor, the model including, for the sensor and each of the objects, information about a respective location of the sensor and a velocity of the sensor in three-dimensional space, and
    for at least one point in time, determining a set of detections as if obtained by the sensor when scanning a field of view of the sensor, wherein each of the detections corresponds to a different line of sight originating from the sensor and comprises information about orientation of the respective line of sight and about the distance between a respective target point and the sensor, the target point being the point in space where the line of sight first crosses any of the objects at the respective point in time,
    modifying the determined set of detections by estimating an effect of sequentially scanning the field of view in discrete time steps on the detections, and
    inversely applying the estimated effect to the set of detections.

2. The method in accordance with claim 1, wherein modifying the determined set of detections comprises:
    defining a scanning order of the detections, and
    for each of the detections:
    determining a scanning delay depending on a position of the detection within the scanning order,
    calculating the location of the respective target point from the orientation of the respective line of sight and the distance between the target point and the sensor,
    based on a location of the target point, calculating a modified location of the target point from the scanning delay and the velocity of the object on which the target point is located,
    based on the modified location of the target point, calculating a modified distance between the target point and the sensor and a modified orientation of the line of sight such that the line of sight crosses the target point at the modified location, and
    modifying the detection so as to comprise information about the modified orientation and the modified distance.

3. The method in accordance with claim 2, wherein modifying the determined set of detections further comprises:
    for each of the detections, determining an aligned orientation by approximating the respective modified orientation to the orientation of the original line of sight most closely corresponding to the line of sight having the modified orientation.

4. The method in accordance with claim 1, wherein the determined set of detections is further modified by:
    after inversely applying the estimated effect to the set of detections, aligning the detections with a scanning grid defined by the original orientations of the lines of sight.

5. The method in accordance with claim 4, wherein modifying the determined set of detections further comprises:
    for each of the detections, calculating an aligned location of the respective target point from the aligned orientation of the respective line of sight and a modified distance between the target point and the sensor.

6. The method in accordance with claim 1, wherein the scanning distance sensor comprises a LIDAR sensor.

7. The method in accordance with claim 1, further comprising:
outputting the modified set of detections for enabling prototyping of parameters of the scanning distance sensor to closely correspond to results obtained from an actual scanning distance sensor.

8. The method in accordance with claim 7, wherein inversely applying the estimated effect to the set of the detections causes the effects of sequential scanning to be omitted from the set of detections.

9. A non-transitory computer readable media comprising instructions that when executed, configure a computing device to execute instructions that cause the computing device to model a scanning distance sensor by at least:
defining a model of the sensor and of one or more objects in surroundings of the sensor, the model including, for the sensor and each of the objects, information about a respective location of the sensor and a velocity of the sensor in three-dimensional space, and
for at least one point in time, determining a set of detections as if obtained by the sensor when scanning a field of view of the sensor, wherein each of the detections corresponds to a different line of sight originating from the sensor and comprises information about orientation of the respective line of sight and about the distance between a respective target point and the sensor, the target point being the point in space where the line of sight first crosses any of the objects at the respective point in time,
modifying the determined set of detections by estimating an effect of sequentially scanning the field of view in discrete time steps on the detections, and
inversely applying the estimated effect to the set of detections.

10. The computer readable media in accordance with claim 9, wherein, when executed, the instructions cause the computing device to modify the determined set of detections by:
defining a scanning order of the detections, and
for each of the detections:
determining a scanning delay depending on a position of the detection within the scanning order,
calculating the location of the respective target point from the orientation of the respective line of sight and the distance between the target point and the sensor,
based on a location of the target point, calculating a modified location of the target point from the scanning delay and the velocity of the object on which the target point is located,
based on the modified location of the target point, calculating a modified distance between the target point and the sensor and a modified orientation of the line of sight such that the line of sight crosses the target point at the modified location, and
modifying the detection so as to comprise information about the modified orientation and the modified distance.

11. The computer readable media in accordance with claim 10, wherein, when executed, the instructions cause the computing device to further modify the determined set of detections by:

for each of the detections, determining an aligned orientation by approximating the respective modified orientation to the orientation of the original line of sight most closely corresponding to the line of sight having the modified orientation.

12. The computer readable media in accordance with claim 11, wherein modifying the determined set of detections further comprises:
for each of the detections, calculating an aligned location of the respective target point from the aligned orientation of the respective line of sight and the modified distance between the target point and the sensor.

13. The computer readable media in accordance with claim 9, wherein, when executed, the instructions cause the computing device to further modify the determined set of detections by:
after inversely applying the estimated effect to the set of detections, aligning the detections with a scanning grid defined by the original orientations of the lines of sight.

14. The computer readable media in accordance with claim 9, wherein the scanning distance sensor comprises a LIDAR sensor.

15. A computing device configured to model a scanning distance sensor by at least:
defining a model of the sensor and of one or more objects in surroundings of the sensor, the model including, for the sensor and each of the objects, information about a respective location of the sensor and a velocity of the sensor in three-dimensional space, and
for at least one point in time, determining a set of detections as if obtained by the sensor when scanning a field of view of the sensor, wherein each of the detections corresponds to a different line of sight originating from the sensor and comprises information about orientation of the respective line of sight and about the distance between a respective target point and the sensor, the target point being the point in space where the line of sight first crosses any of the objects at the respective point in time,
modifying the determined set of detections by estimating an effect of sequentially scanning the field of view in discrete time steps on the detections, and
inversely applying the estimated effect to the set of detections.

16. The computing device in accordance with claim 15, wherein the computing device is configured to modify the determined set of detections by:
defining a scanning order of the detections, and
for each of the detections:
determining a scanning delay depending on a position of the detection within the scanning order,
calculating the location of the respective target point from the orientation of the respective line of sight and the distance between the target point and the sensor,
based on a location of the target point, calculating a modified location of the target point from the scanning delay and the velocity of the object on which the target point is located,
based on the modified location of the target point, calculating a modified distance between the target point and the sensor and a modified orientation of the line of sight such that the line of sight crosses the target point at the modified location, and
modifying the detection so as to comprise information about the modified orientation and the modified distance.

17. The computing device in accordance with claim 16, wherein, the computing device is configured to further modify the determined set of detections by:
- for each of the detections, determining an aligned orientation by approximating the respective modified orientation to the orientation of the original line of sight most closely corresponding to the line of sight having the modified orientation.

18. The computing device in accordance with claim 17, wherein the computing device is configured to modify the determined set of detections by:
- for each of the detections, calculating an aligned location of the respective target point from the aligned orientation of the respective line of sight and the modified distance between the target point and the sensor.

19. The computing device in accordance with claim 15, wherein, the computing device is configured to further modify the determined set of detections by:
- after inversely applying the estimated effect to the set of detections, aligning the detections with a scanning grid defined by the original orientations of the lines of sight.

20. The computing device in accordance with claim 15, wherein the scanning distance sensor comprises a LIDAR sensor.

* * * * *